(12) United States Patent
Richling et al.

(10) Patent No.: US 7,208,843 B2
(45) Date of Patent: Apr. 24, 2007

(54) ROUTING DESIGN TO MINIMIZE ELECTROMIGRATION DAMAGE TO SOLDER BUMPS

(75) Inventors: Wayne Patrick Richling, Ft. Collins, CO (US); Walter John Dauksher, Ft. Collins, CO (US); William S. Graupp, Ft. Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 103 days.

(21) Appl. No.: 11/048,204

(22) Filed: Feb. 1, 2005

(65) Prior Publication Data

US 2006/0170100 A1 Aug. 3, 2006

(51) Int. Cl.
  *H01L 23/48* (2006.01)
  *H01L 23/52* (2006.01)
  *H01L 29/40* (2006.01)

(52) U.S. Cl. .......... 257/784; 257/E23.02; 257/E21.508; 257/E23.021; 257/774; 257/773; 257/680; 257/758; 438/612

(58) Field of Classification Search .............. 257/736, 257/737, 738, 778, 779, E23.02, E23.021, 257/E21.508, 784, 786, 459, 676, 773, 774, 257/776, 680; 438/612
See application file for complete search history.

(56) References Cited

U.S. PATENT DOCUMENTS

| | | | | |
|---|---|---|---|---|
| 5,777,486 A | * | 7/1998 | Hsu | 324/763 |
| 6,504,252 B2 | * | 1/2003 | Matsunaga | 257/758 |
| 6,521,996 B1 | * | 2/2003 | Seshan | 257/737 |
| 6,825,541 B2 | * | 11/2004 | Huang et al. | 257/459 |
| 7,081,405 B2 | * | 7/2006 | Chien | 438/613 |
| 2003/0167632 A1 | * | 9/2003 | Thomas et al. | 29/841 |
| 2004/0113261 A1 | * | 6/2004 | Sunohara et al. | 257/700 |
| 2005/0040527 A1 | * | 2/2005 | Huang | 257/736 |
| 2006/0043608 A1 | * | 3/2006 | Bernier et al. | 257/784 |
| 2006/0186539 A1 | * | 8/2006 | Dauksher et al. | 257/737 |

\* cited by examiner

*Primary Examiner*—Alexander Oscar Williams

(57) ABSTRACT

A novel pad structure for an integrated circuit component that utilizes a bump interconnect for connection to other integrated circuit components that produces a relatively uniform current distribution within the bump of the bump interconnect is presented. The pad structure includes an inner pad implemented on an inner conductive layer of the integrated circuit component, an outer pad implemented on an outer conductive layer of the integrated circuit component, and a plurality of vias connecting the inner pad and outer pad. The outer pad is sealed preferably around its edges with a passivation layer, which includes an opening exposing a portion of the outer pad. The vias connecting the inner pad and outer pad are preferably implemented to lie in a via region within the footprint of the pad opening.

14 Claims, 4 Drawing Sheets

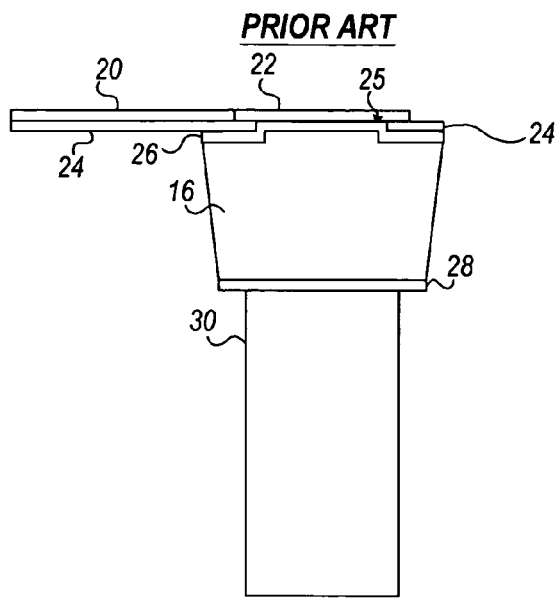
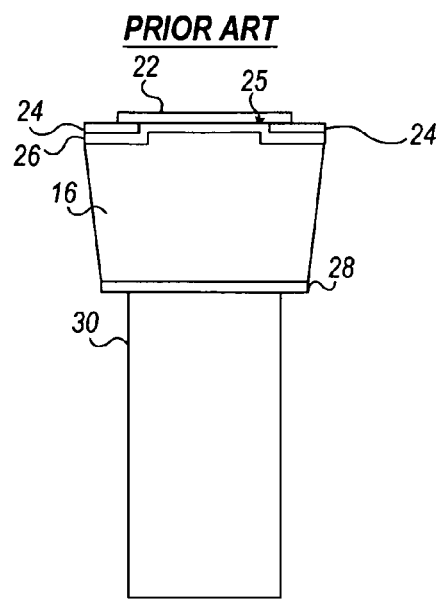
FIG. 3A    FIG. 3B
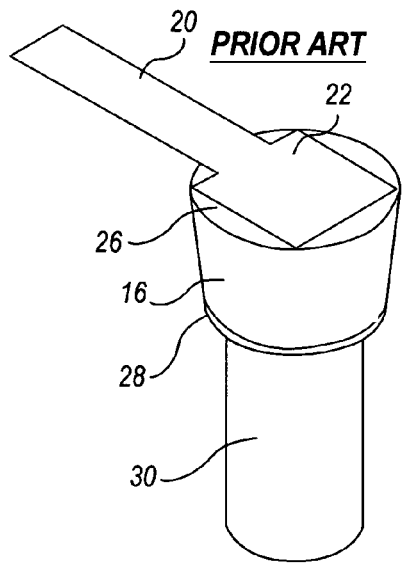
FIG. 3C
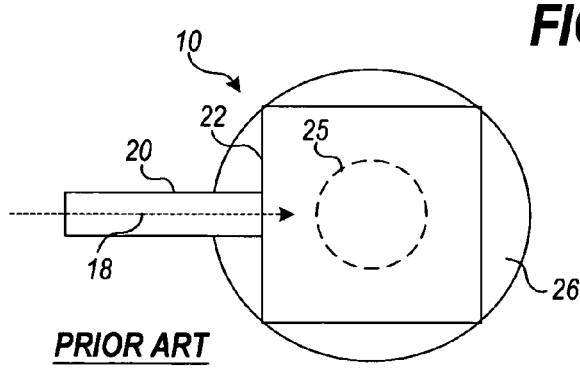
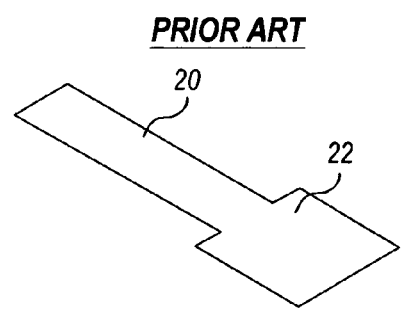
FIG. 3D    FIG. 3E

ROUTING DESIGN TO MINIMIZE ELECTROMIGRATION DAMAGE TO SOLDER BUMPS

BACKGROUND OF THE INVENTION

The present invention relates generally to flip chip packaging technologies for integrated circuits more particularly to a methodology and trace design for minimizing electromigration damage to integrated circuit connection joints such as solder bumps in a flip-chip assembly.

Electromigration is the movement of material within a conductor that is caused by the flow of electrical current. Electromigration can cause the complete depletion of material within a conductor leading to the loss of continuity. The effect is more apparent at interconnect junctions, for example, in a solder bump connecting a flip-chip die and substrate, and is dependent on the current density (higher being worse than lower), the material (some materials resisting the effects of electromigration more than others), and the geometry of the structure.

Electromigration is a problem commonly seen in high-current-flow bumps of flip-chip assemblies, so named because during formation, the die pads are formed on the top layer of the integrated circuit die, bumps are added, and the die is then "flipped" over and connected directly to the chip substrate via the bumps. More specifically, and with reference to FIGS. 1 and 2, circuit components are formed on a semiconductor wafer using standard fabrication techniques, with local interconnect layers (formed of interleaved metal and dielectric layers) situated closer to the functional circuitry and global interconnect layers formed further up the sequence of layers. Die pads 22 are formed in the uppermost metal layer. Bumps are then added, and the wafer is diced into individual integrated circuit die 14 for packaging. An individual die 14 is then "flipped" over and attached directly to a substrate 12 or board through the bumps 16, as shown in FIG. 1.

Bumps 16 are formed through one of several different processes, including solder bumping, using processes that are well known in the art. FIG. 2 illustrates a portion of a flip-chip assembly 10 which utilizes solder bumps 16. In the solder bumping process, an under bump metallization (UBM) 26 is applied to the chip bond pads, by sputtering, plating, or other means, to replace the insulating passivation layer 24 (typically comprising a polymer such as Benzoclyclobutene or "BCB") typically applied over the top metal layer, and to define and limit the solder-wetted area. Solder is deposited over the UBM 26 by evaporation, electroplating, screen printing solder paste, or needle-depositing.

FIG. 1 illustrates an example of a typical path of current flow 18 in a flip-chip assembly 10 that utilizes a conductive bump 16 for interconnecting the pads (not visible) of an integrated circuit die 14 to pads (not visible) on a chip substrate 12. As shown, a typical current path 18 flows from circuitry (not visible) on the substrate 12, through a bump 16a, through circuitry (not visible) on the die 14, and finally from the die 14 through another bump 16b and into other circuitry (not visible) on the substrate 12. A bump 16 is the element in the current flow path 18 that is often the most susceptible to electromigration damage due to its material, typically a solder, and the fact that the current flow must change directions.

As shown in more detail in FIG. 2, current flowing through the trace 20 and pad 22 within the die 14 must change direction in order to flow through an opening 25, through the conductive pad-to-bump interface (referred to hereinafter as the UBM) 26, through the bump 16 itself, and finally into the substrate pad 28. As indicated with dotted arrows 15 in FIG. 2, this turning causes the current to "crowd" at the upstream side of the bump 16, resulting in a higher current density, J, in the location of crowding. The mean time to fail (MTTF) under electromigration conditions is generally approximated to be $$MTTF \propto \frac{A}{J^n}$$

where A incorporates the effects of temperature and other factors and the power n is in the range of 1 to 2 for lead solders. High local values of the current density, J, may cause failures that are premature in time when compared with the failures that occur when the current is uniformly distributed in the bump 16.

The amelioration of electromigration in bump interconnects is the subject of much study. One prior art solution includes the use of a "bus" structure for high current bumps in order to limit the routable regions within the metal layer(s) used for the bus.

The cross-sectional area of a bump affects the rate of electromigration in the bump. Bump cross-sectional area is partially dictated by the bump-to-bump spacing, with higher spacing typically permitting greater cross-sectional area of the bumps. However, with the competition for smaller and faster packaging, the trend has been towards shrinking the bump-to-bump spacing. Thus, future bumps may have smaller cross-sections, leading to the problem of higher current densities in the bumps.

The choice of material used to implement the bump can also play a significant factor in the electromigration properties of the bump. Presently, bump material is typically made of either a 90% Pb (lead) solder that is known to exhibit some electromigration resistance or a lead-tin eutectic solder that has significantly less resistance to electromigration damage. Future designs may use lead-free materials which have unknown electromigration issues. The ability to remove the electromigration design restrictions as materials change could be an important design asset.

Present designs employ multiple bumps for high current circuits. More electromigration resistant designs may enhance present configurations by carrying these high currents in fewer bumps, thereby reducing chip size and cost or by freeing up bumps for other functions. Future designs could also enjoy these benefits. These advantages may also be shared by lower current signal bumps where, for example, traces may be made narrower which would result in routing enhancements.

In view of the foregoing, it would be desirable to have a technique for equalizing the distribution of current flow through bumps of BGAs or flip-chip packages in order to reduce electromigration caused by current crowding in one area of the bump, and a novel pad structure that produces the same.

SUMMARY OF THE INVENTION

A novel pad structure and current routing design for pads of an integrated circuit component are described in detail hereinafter. The pad structure of the invention includes a first pad implemented on an inner conductive layer of an integrated circuit component, a second pad implemented on an outer conductive layer of the integrated circuit, and a plurality of vias each directly connecting the inner pad to the outer pad. A current delivering trace is connected to the first pad. The second, or "outer", pad is sealed around its edges with a passivation layer, which includes an opening exposing the conductive outer pad. The exposed area of the conductive outer pad is hereinafter referred to as the "pad opening". The vias connecting the inner pad to the outer pad are positioned within the footprint of the pad opening. Thus, as current is delivered to the inner pad from the trace, the via impedances, which are each higher than the impedance of the current delivering trace, causes the current to divide and flow to the outer pad over the plurality of vias, thus distributing the current and reducing current crowding at the inner pad. At a minimum this results in a reduction in the maximum current density seen on the outer pad, and therefore a reduction in electromigration damage in the solder bump caused by current crowding. With a small amount of additional planning with regards to the selection of the number and layout of the vias connecting the inner and outer pads within the footprint of the pad opening, the current flow to the outer pad can be optimized to produce a relatively uniform current density.

More generally, the pad structure of the invention may be implemented in any integrated circuit component that employs pads for interconnection to other circuit components and that is fabricated with interleaved conductive and dielectric layers. Integrated circuit components that may use the pad structure and routing design of the invention include integrated circuit dies, integrated circuit substrates, integrated circuit packages, and printed circuit boards (PCBs).

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 3A is a cross-sectional side view of the components included in a single bump junction of the flip-chip assembly of FIG. 1;

FIG. 3B is a cross-sectional front view of the bump junction of FIG. 3A;

FIG. 3C is an isometric view of the bump junction of FIG. 3A;

FIG. 3D is a top plan view of the bump junction of FIG. 3A;

FIG. 3E is a perspective view of the trace and pad of FIGS. 3A–3D;

DETAILED DESCRIPTION

Figure 1:
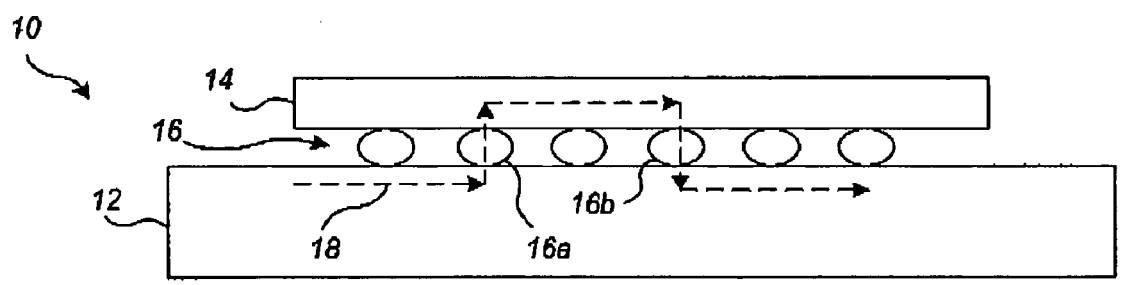
FIG. 1 is a cross-sectional side view of a flip-chip assembly.

A novel design for integrated circuit component pads is described in detail below that seeks to achieve a reasonably uniform current distribution on the outer pad interface to assist in reducing electromigration damage in a joint (e.g., flip-chip bump) connected to the pad. For purposes of comparison, the configuration of a traditional prior art solder bump in a flip-chip assembly is shown in FIGS. 3A, 3B, 3C, 3D, and 3E. More particularly, FIG. 3A is a cross-sectional side view, FIG. 3B is a cross-sectional front view, FIG. 3C is an isometric view, and FIG. 3D is a top plan view of the components included in a single bump junction of the flip-chip assembly 10 of FIG. 1. FIG. 3E is a perspective view of the trace 20 and pad 22 of FIGS. 3A–3D. As illustrated in FIGS. 3A, 3B, 3C, and 3D, the trace 20 is conductively connected to the pad 22 on the outermost trace layer of the integrated circuit 14 (of FIG. 1). The pad 22 is capped with a passivation layer 24, typically comprising either a nitride or a polymer. An opening 25 is etched into the passivation layer 24 and the UBM 26 is plated over both the opening 25 and a portion of the passivation layer 24. Solder attaches to the UBM 26 during the bumping process to form bump 16, which conductively connects the UBM 26 and the substrate pad 28 when the die is flipped and attached to the substrate 12. The substrate pad 28 is connected to substrate via 30 for routing to circuitry implemented on or otherwise connected to the substrate 12.

Figure 2:
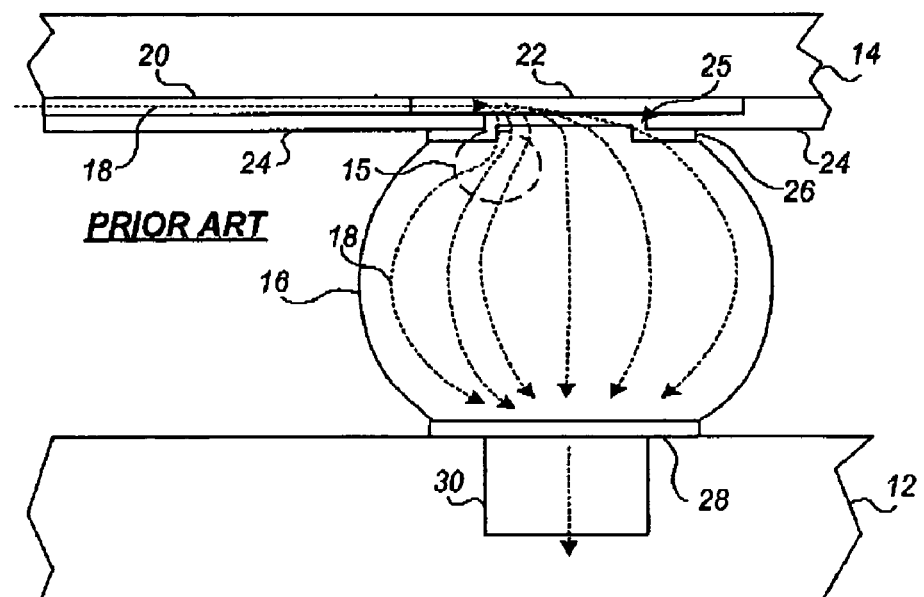
FIG. 2 is a cross-sectional side view of a portion of a flip-chip assembly illustrating a single solder bump junction.

In the traditional configuration, as shown in FIG. 3D, current enters the pad 22 from the trace 20 along the path 18, and, as illustrated in FIG. 2, causes the greatest current densities in the solder bump 16 in the area indicated at 15 near the opening to the pad 22 closest to the trace 20.

Figure 4A:
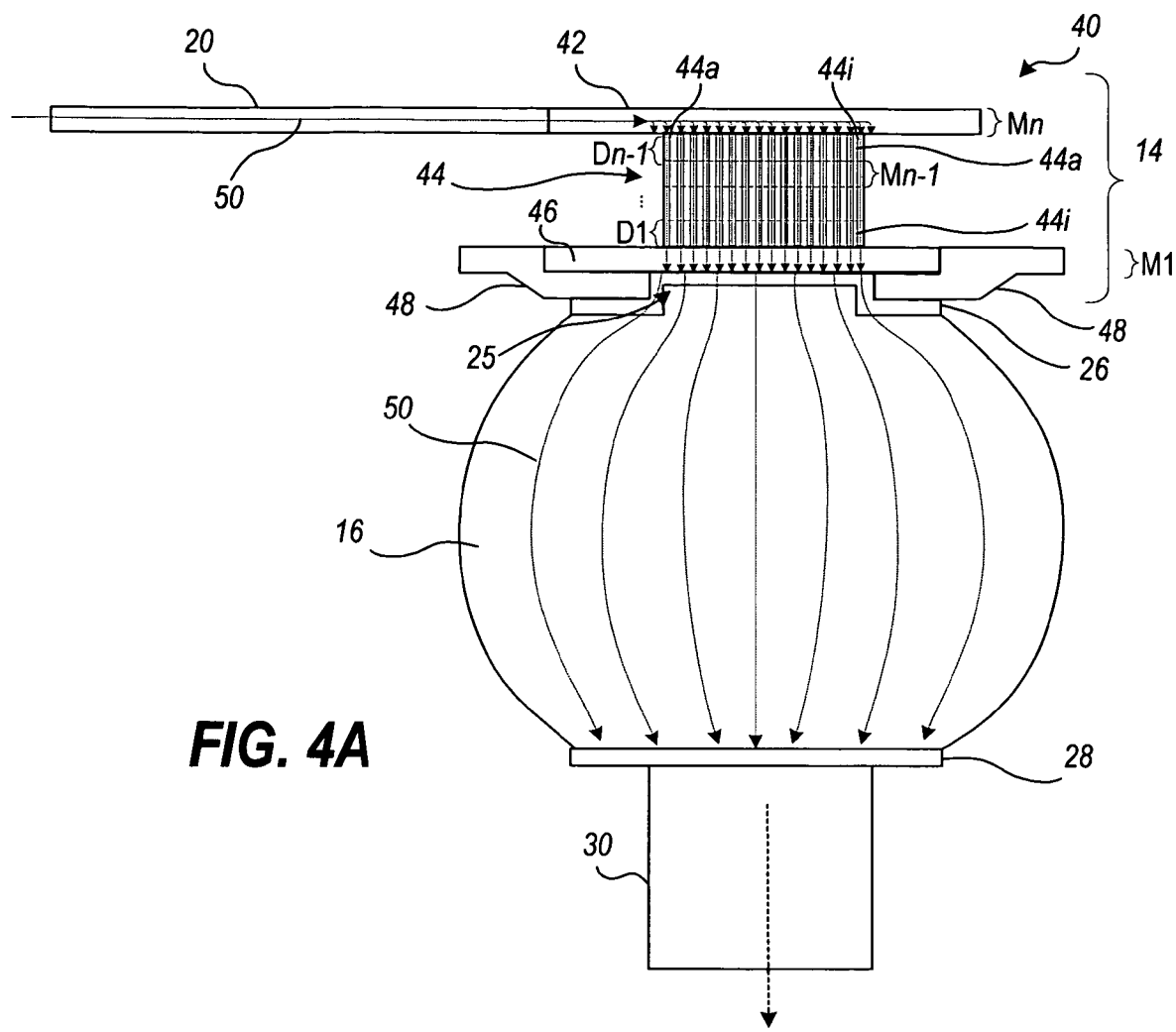
FIG. 4A is a cross-sectional side view of a portion of a flip-chip assembly implementing a pad structure in accordance with the invention.
Figure 4B:
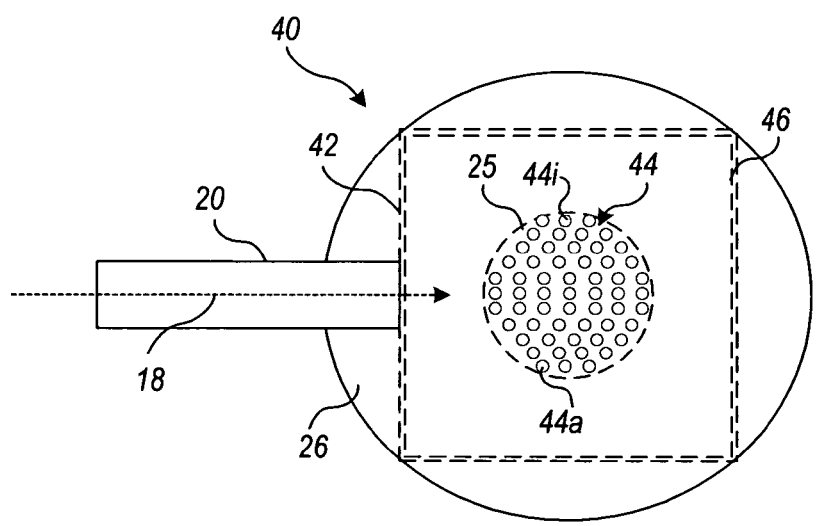
FIG. 4B is a top plan view of the pad structure of FIG. 4A illustrating the plurality of vias arranged in an example distributed configuration within the via region.

In a design implemented according to the present invention, as shown in FIGS. 4A and 4B, the trace 20 is conductively connected to a first (or "inner") pad 42 implemented on an internal metal layer Mn of the die. The inner pad 42 is conductively connected to a second (or "outer") pad 46 implemented on an outer metal layer M1 of the die by way of a plurality of conductive vias 44a–44i within a via region 44. Each via 44a–44i in the via region 44 passes through each of intervening layers of metal Mn–1 and dielectric D1, . . . , Dn. The outer pad 46 is capped with a passivation layer 48. An opening 25 to the pad is etched into the passivation layer 48 and the UBM 26 is plated over both the pad opening 25 and a portion of the passivation layer 48. Solder attaches to the USM 26 during the bumping process to form bump 16, which conductively connects the UBM 26 and the substrate pad 28 when the die is flipped and attached to the substrate 12. The substrate pad 28 is connected to substrate via 30 for routing to circuitry implemented oil or otherwise connected to the substrate 12. The metal layers M1, . . . , Mn, vias, and UBM are preferably implemented using highly conductive material and the layers D1, . . . , Dn–1 and 48 are preferably implemented in dielectric materials.

The number of vias 44a–44i implemented in a given pad structure will depend on the requirements of the particular integrated circuit design, the tradeoff of current distribution in the pad to reduce electromigration damage in the bump 16 being increased resistance in the pad, and therefore increased power dissipation by the chip. FIG. 4B shows an example top plan view of the pad structure with a number of vias 44a–44i arranged in an example uniformly distributed configuration. As shown, the connection of the vias to the outer pad 46 lies in a via region 44 is within the footprint of the pad opening 25. As defined herein, the "footprint" is coaxial with the pad opening 25, and is identical in both shape and orientation to the pad opening 25, but lies on the opposite face of the outer pad 46. The selection of the number of vias 44a–44i within the via region 44 as well as the selection of the relative area of the via region 44 with respect to that of the opening 25 dictate the maximum current density within the bump 16.

The vias 44a–44i provide two benefits. The first is That the impedances of the vias 44a–44i, which may be adjusted during the design phase to obtain a desirable current distribution, causes current flow (indicated by arrow 50) passing from the trace 20 to the bump 18 to distribute more uniformly within the inner pad 42 that is connected directly to the trace 20, thereby reducing the current crowding at an upstream location of the pad structure. The second benefit of the vias 44a–44i is that when the vias 44a–44i are positioned for connection within the footprint of the pad opening 25 (i.e., the footprint of the outer-pad-to-UBM interface), adverse current concentration effects that occur when current enters the outer pad opening 25 to the UBM 26 from a radial location outside the footprint of the outer pad opening 25 are minimized.

A sample analysis of the traditional pad structure of FIGS. 3A–3E and the invention-based pad structure of FIGS. 4A and 4B using three-dimensional finite element models in which the current density distribution within the bump (and, in particular, at the interface with the UBM) is determined shows that the pad structure 40 of the invention has significantly lower maximum current densities at the critical pad-to-UBM interface location than those in the traditional pad structure 10. The maximum current densities are taken to be indicative of the electromigration life of the bumps 16 in each configuration.

Select physical dimensions used in the analysis are as follows: The planar dimensions of the pads 22, 42, and 46 are 80 um×80 um. The diameter of the BCB opening is 60 um. The thickness of the metal layers M1, . . . , Mn are each 0.9 um. The diameter of the UBM 26 is 110um. The width of the trace 20 is 20 um. The height of each of the vias 44a–44i is 0.65 um. Due to the discrete nature of the vias 44a–44i, the areal coverage of metal on the pads 42, 46 by connection of the vias 44a–44i to the pads 42, 46 is approximately 12% (this partial coverage by the via metal leads to the resistance that aids the spreading of the current in the inner trace 42). In the analysis, the diameter of the region containing the vias 44a–44i was varied between 10 and 70 um. The circular region containing the vias was centered on the center of the opening 25.

Figure 5:
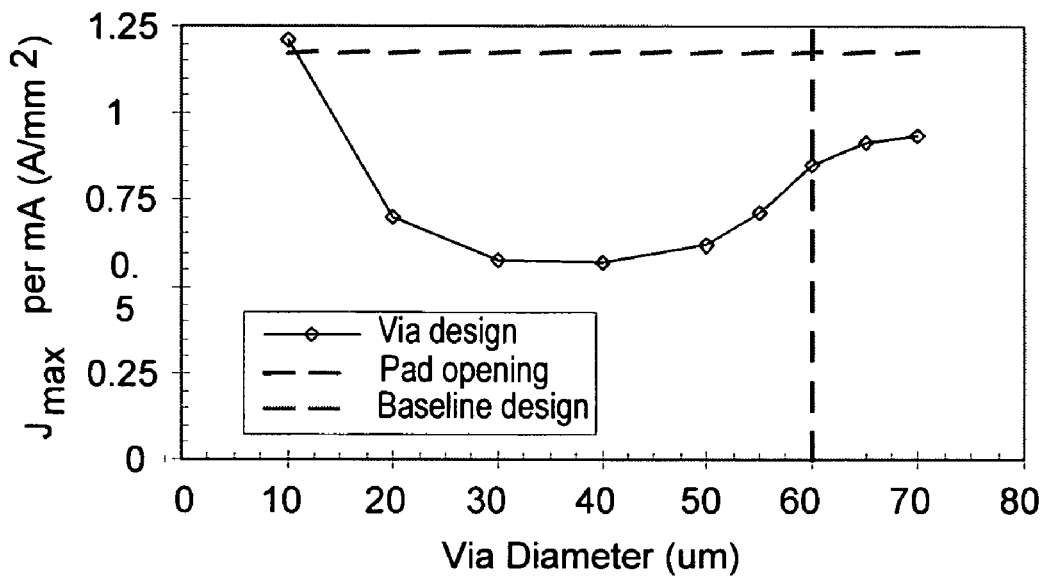
FIG. 5 is a graph illustrating maximum bump current densities for different diameters of the region containing the plurality of vias.

FIG. 5 shows a graph of the maximum current densities at the UBM side of the bumps, a critical location for the configurations considered, resulting from the analysis. As illustrated by FIG. 5, the use of a plurality of vias 44a–44i between the inner current carrying metal layer Mn and the outer pad layer M1 produces current density values of approximately 1.2 for a prior art pad structure and 0.9 for the pad structure of FIGS. 4A and 4B for a via diameter of 70 um, corresponding to a drop in maximum current densities for the pad structure of the invention on the order of 25% for this case.

FIG. 5 also illustrates that the placement of each of the vias 44a–44i for connection to the outer pad 46 within the footprint of the pad opening 25 can produce additional decreases in maximum current densities. This is seen for the case of via-containing-region diameters of 30–40 um, where the pad structure 40 of the invention roughly halves the maximum current density when compared with the pad structure 10 of the traditional design.

Figure 6:
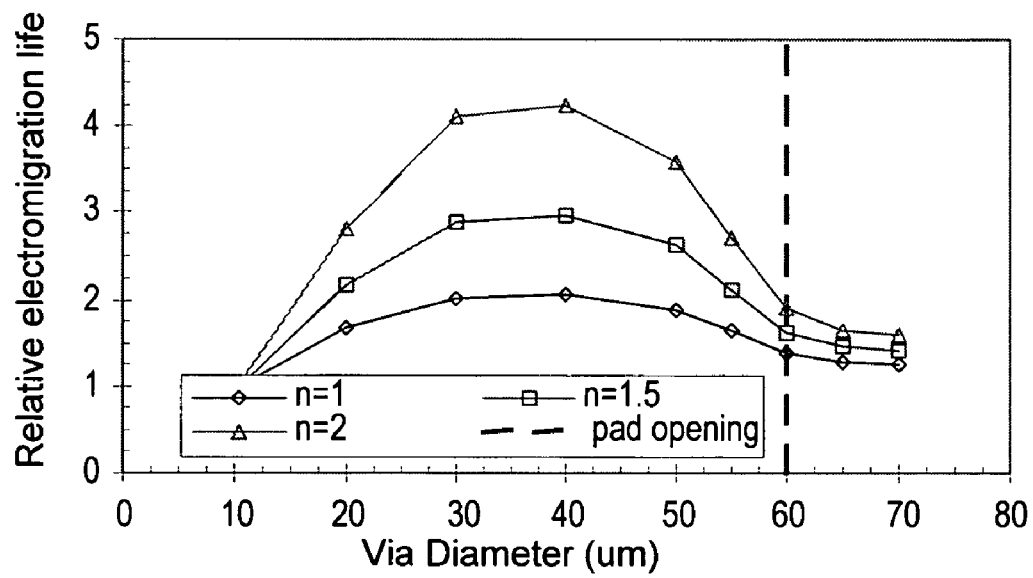
FIG. 6 is a graph illustrating projections of the relative electromigration life as influenced by various diameters of the region containing the plurality of vias and as influenced by the exponent describing the dependence of electromigration life on maximum current density for bumps connected to the pad structure of the invention.

FIG. 6 is a graph illustrating the relative electromigration life of a bump 16 using the pad structure 40 of the invention versus the diameter of the region containing the vias 44a–44i for various values of the power exponent n, thereby illustrating the possible increases in electromigration life associated with the results of the analysis described above. The exponent, n, is varied from 1 to 2, which are in line with known data for lead solders. For the design conditions examined, a pad structure 40 of the invention may have electromigration life improvements of two to four times that of pad structures 10 of traditional designs.

It will be appreciated by those skilled in the art that the same invention-based design philosophy may be applied, for example, within the pad/via/trace design in the substrate.

Analysis and comparison of traditional and invention-based pad configurations in determining the current density distribution within the bump and, in particular, at the pad-to-UBM interface, shows that a design implemented according to the principles of the invention has significantly lower maximum current densities at the critical pad-to-UBM interface location than those in the traditional design. The maximum current densities are taken to be metrics for the electromigration life of the bumps in each configuration.

In summary, the novel pad structure and routing design of the invention serves to distribute current flowing in from a current delivering trace across the inner pad and into a plurality of vias connecting the inner pad to the outer pad to achieve a relatively uniform current distribution on the outer pad, thereby ameliorating electromigration in integrated circuit joints connected to the outer pad (such as flip-chip bumps) due to current crowding.

While the illustrative embodiments of the invention as presented herein address the metal traces within the die, the invention is applicable generally any integrated circuit component that includes interleaved layers of metal and dielectrics, for example, an integrated circuit die, an integrated circuit substrate, an integrated circuit chip package, a printed circuit board, etc., and which utilizes a joint such as a bump to another same or different such integrated circuit component. For example, the pad structure of the invention may be implemented within an integrated circuit substrate, a PCB, and/or an interconnect layer of a chip package at pads of the respective substrate, PCB, and/or package where the combination of current levels, changes in current direction and material sensitivity lead to electromigration problems.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A pad structure of an integrated circuit component, comprising:
    an inner pad implemented on an inner conductive layer of the integrated circuit component;
    an outer pad implemented on an outer conductive layer of the integrated circuit component;
    a plurality of vias, each of the plurality of vias connecting the inner pad to the outer pad; and a passivation layer layered over an outer surface of the outer pad, the outer surface of the outer pad facing away from the inner pad, the passivation layer having a pad opening exposing a portion of the outer surface of the outer pad, wherein the plurality of vias are positioned in a via region within a footprint of the pad opening.

2. The pad structure of claim 1, wherein:

the plurality of vias are uniformly distributed within the via region.

3. The pad structure of claim 1 further comprising:

an under bump metallization (UBM) layer conductively layered over the exposed portion of the outer pad at the pad opening; and a conductive bump attached to the UBM.

4. The pad structure of claim 3, wherein:

the plurality of vias are uniformly distributed within the via region.

5. A method for implementing an integrated circuit component, the integrated circuit component comprising an outer pad for connection to an external integrated circuit component joint and a trace for delivering current to the outer pad, the method comprising the steps of:

connecting the trace to an inner pad implemented on an inner conductive layer of the integrated circuit component;

connecting each of a plurality of conductive vias between the inner pad and the outer pad;

applying a passivation layer over an outer surface of the outer pad, the outer surface of the outer pad facing away from the inner pad; and exposing a pad opening to the outer surface of the outer pad through the passivation layer, wherein the plurality of vias are positioned in a via region within a footprint of the pad opening.

6. The method of claim 5, further comprising the step of:

uniformly distributing the plurality of vias within the via region.

7. The method of claim 5, further comprising the steps of:

applying an under bump metallization (UBM) layer over the exposed portion of the outer pad at the pad opening; and attaching a conductive bump to the UBM.

8. The method of claim 7, wherein:

uniformly distributing the plurality of vias within the via region.

9. The pad structure of claim 1, wherein the plurality of vias passes through intermediate metal and dielectric layers between the inner pad and the outer pad.

10. The pad structure of claim 1, wherein the plurality of vias aerially covers about 12% of the inner and the outer pads.

11. The pad structure of claim 1, wherein the via region has a diameter that ranges from 33 to 83% of a diameter of the pad opening.

12. The method of claim 5, wherein the plurality of vias passes through intermediate metal and dielectric layers between the inner pad and the outer pad.

13. The method of claim 5, wherein the plurality of vias aerially covers about 12% of the inner and the outer pads.

14. The method of claim 5, wherein the via region has a diameter that ranges from 33 to 83% of a diameter of the pad opening.

* * * * *